United States Patent
Watanabe et al.

(10) Patent No.: US 12,374,967 B2
(45) Date of Patent: Jul. 29, 2025

(54) MOTOR DRIVE DEVICE AND METHOD FOR MANUFACTURING SAME

(71) Applicant: FANUC CORPORATION, Minamitsuru-gun (JP)

(72) Inventors: Masato Watanabe, Yamanashi-ken (JP); Taku Sasaki, Yamanashi-ken (JP)

(73) Assignee: FANUC CORPORATION, Yamanashi-ken (JP)

( * ) Notice: Subject to any disclaimer, the term of this patent is extended or adjusted under 35 U.S.C. 154(b) by 315 days.

(21) Appl. No.: 17/795,118

(22) PCT Filed: Jan. 25, 2021

(86) PCT No.: PCT/JP2021/002363
§ 371 (c)(1),
(2) Date: Jul. 25, 2022

(87) PCT Pub. No.: WO2021/153476
PCT Pub. Date: Aug. 5, 2021

(65) Prior Publication Data
US 2023/0066238 A1  Mar. 2, 2023

(30) Foreign Application Priority Data

Jan. 31, 2020 (JP) .................................. 2020-014835

(51) Int. Cl.
*H02K 11/33* (2016.01)
*H02K 5/22* (2006.01)
*H05K 1/18* (2006.01)

(52) U.S. Cl.
CPC ............. *H02K 11/33* (2016.01); *H02K 5/225* (2013.01); *H05K 1/181* (2013.01); *H02K 2211/03* (2013.01)

(58) Field of Classification Search
CPC ........... H02K 2211/00; H02K 2211/03; H02K 2203/03; H02K 11/33; H02K 5/225;
(Continued)

(56) References Cited

U.S. PATENT DOCUMENTS 7,119,437 B2 * 10/2006 Morita .................... H01L 24/49
257/691
7,643,296 B2 * 1/2010 Yamada .................... F24F 1/12
361/704
(Continued)

FOREIGN PATENT DOCUMENTS

JP  H2-194692 A  8/1990
JP  H3-250784 A  11/1991
(Continued)

OTHER PUBLICATIONS

International Search Report (ISR) (PCT Form PCT/ISA/210), in PCT/JP2021/002363, dated Apr. 13, 2021.

*Primary Examiner* — Alex W Mok
(74) *Attorney, Agent, or Firm* — Sughrue Mion, PLLC (57) ABSTRACT

Provided are a motor drive device that reduces the likelihood of mounting error during manufacture, and a method for manufacturing the same. The motor drive device is provided with: a substrate; a first mounting region for mounting first circuit component; a second mounting region for mounting a second circuit component; a first pair of connection points for connecting a first connecting wire member, constituting a first path for supplying electric current to the first circuit component, onto the substrate such that at least a part of the first connecting wire member overlaps the second mounting region; and a second pair of connection points for connecting second connecting wire member, constituting a second path for supplying electric current to the second circuit component, onto the substrate such that at least a part of the (Continued)

second connecting wire member overlaps the first mounting region.

7 Claims, 4 Drawing Sheets

(58) Field of Classification Search
CPC ............... H05K 1/181; H05K 1/0263; H05K 2201/10295; H05K 2201/10272; H05K 2201/10363
USPC .......................................................... 310/71
See application file for complete search history.

(56) References Cited

U.S. PATENT DOCUMENTS

| | | | | |
|---|---|---|---|---|
| 7,989,997 | B2 * | 8/2011 | Hashimoto | B62D 5/0406 |
| | | | | 310/68 R |
| 8,288,658 | B2 * | 10/2012 | Uchida | H02M 7/003 |
| | | | | 361/767 |
| 8,552,604 | B2 * | 10/2013 | Matsuda | H02K 5/08 |
| | | | | 310/43 |
| 9,000,702 | B2 * | 4/2015 | Huynh et al. | H02P 6/14 |
| | | | | 318/400.27 |
| 9,490,200 | B2 * | 11/2016 | Yoshihara | H01L 24/90 |
| 9,523,720 | B2 * | 12/2016 | Ausserlechner | G01R 19/00 |
| 10,165,673 | B2 * | 12/2018 | Tsukuda | H03H 7/0138 |
| 10,284,109 | B2 * | 5/2019 | Bando | H01L 25/162 |
| 10,285,286 | B2 * | 5/2019 | Asao | B62D 5/0463 |
| 10,454,259 | B2 * | 10/2019 | Kakuno | G01R 1/203 |
| 2013/0221532 | A1 * | 8/2013 | Fujita | H01L 24/34 |
| | | | | 257/773 |
| 2017/0033812 | A1 * | 2/2017 | Son et al. | H04B 1/0483 |
| | | | | 455/103 |
| 2017/0305456 | A1 * | 10/2017 | Iwabuki | H02P 6/10 |
| 2018/0093698 | A1 * | 4/2018 | Urimoto | B62D 5/0481 |
| 2018/0241319 | A1 * | 8/2018 | Bando | H01L 25/18 |
| 2019/0276071 | A1 * | 9/2019 | Nagashima | H02P 25/22 |
| 2019/0281694 | A1 * | 9/2019 | Chen | H05K 1/14 |
| 2020/0053868 | A1 * | 2/2020 | Park et al. | H05K 1/181 |
| | | | | 345/212 |

FOREIGN PATENT DOCUMENTS

| | | |
|---|---|---|
| JP | H7-231150 A | 8/1995 |
| JP | 2004-281679 A | 10/2004 |
| JP | 2011-254023 A | 12/2011 |
| JP | 2018-88813 A | 6/2018 |
| JP | 2018-136144 A | 8/2018 |
| JP | 2019-161804 A | 9/2019 |

* cited by examiner

MOTOR DRIVE DEVICE AND METHOD FOR MANUFACTURING SAME

TECHNICAL FIELD

The present invention relates to a motor driving device (motor drive device) used for driving a motor, and a method for manufacturing the same.

BACKGROUND ART

A motor driving device for driving a motor generally includes a wiring board (circuit board) on which electronic components are mounted. At this time, a different circuit (circuit component) may be used depending on the type of motor (for example, a motor used for outputting) or the like (see, for example, JP 2018-136144 A). In this instance, for example, any one of components for use with a large electrical current, and components for use with a small electrical current are arranged on a common wiring board. Consequently, it is possible to appropriately manufacture circuits for use with a large electrical current and circuits for use with a small electrical current. By doing so, it becomes possible to appropriately select components, to mount such components on a common wiring board, and to manufacture different circuits on a common production line.

However, in the case that different components are selected and mounted on such a common wiring board, there is a possibility that the selected components and the mounted locations thereof may be erroneous (a mounting error may occur). Especially in the case of mass production, the line speed becomes higher, and the possibility of mounting errors increases. Such mounting errors result in a loss in production, and are not preferable.

SUMMARY OF THE INVENTION

The present invention has the object of providing a motor driving device and a method for manufacturing the same, which aim to reduce the likelihood of a mounting error at a time of manufacturing.

A motor driving device according to an aspect of the present invention comprises a wiring board, a first mounting region on the wiring board, the first mounting region being configured to enable a first circuit component to be mounted therein, a second mounting region on the wiring board, the second mounting region being configured to enable a second circuit component to be mounted therein, a first pair of connecting points configured to connect a first connecting wire member, which constitutes a first path through which an electrical current is supplied to the first circuit component, onto the wiring board in a manner so that at least a portion of the first connecting wire member overlaps with the second mounting region, and a second pair of connecting points configured to connect a second connecting wire member, which constitutes a second path through which an electrical current is supplied to the second circuit component, onto the wiring board in a manner so that at least a portion of the second connecting wire member overlaps with the first mounting region.

A method for manufacturing a motor driving device according to an aspect of the present invention comprises a preparation step of preparing a printed wiring board, the printed wiring board including a first mounting region configured to enable a first circuit component to be mounted therein, a second mounting region configured to enable a second circuit component to be mounted therein, a first pair of connecting points on a wiring board which, by being connected to each other, constitute a portion of a first path through which an electrical current is supplied to the first circuit component, and a second pair of connecting points on the wiring board which, by being connected to each other, constitute a portion of a second path through which an electrical current is supplied to the second circuit component, a mounting step of mounting the first circuit component in the first mounting region, or alternatively, mounting the second circuit component in the second mounting region, and a connection step of connecting the first pair of connecting points by a first connecting wire member at least a portion of which overlaps with the second mounting region, in a case that the first circuit component is mounted in the mounting step, and connecting the second pair of connecting points by a second connecting wire member at least a portion of which overlaps with the first mounting region, in a case that the second circuit component is mounted in the mounting step.

According to the present invention, the motor driving device and the method for manufacturing the same can be provided, which aim to reduce the likelihood of a mounting error at a time of manufacturing.

DESCRIPTION OF THE INVENTION

A motor driving device and a method for manufacturing the same according to the present embodiment will be presented and described in detail below with reference to the accompanying drawings.

The motor driving device is a device that outputs an electrical current for driving a motor, and includes various circuits for driving and controlling the motor. The motor driving device can be equipped with, for example, any one of the following motor driving circuits 20a and 20b, depending on whether the motor that is driven has a large output or a small output.

Figure 1:
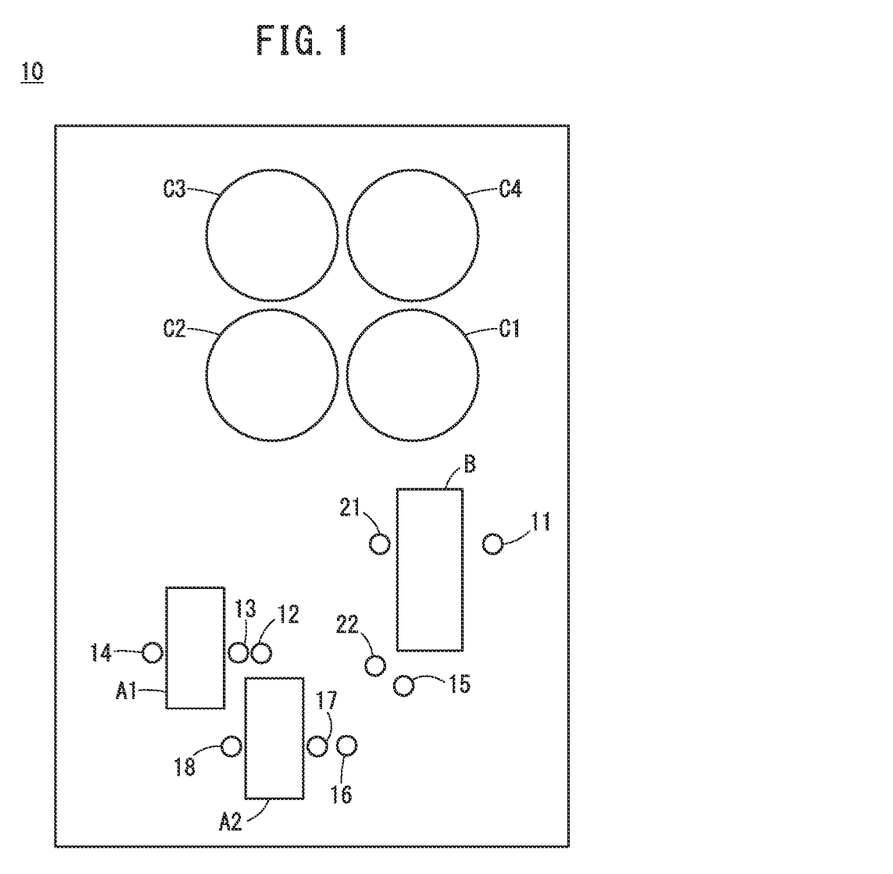
FIG. 1 is a diagram showing a printed wiring board (circuit board) for use with a motor driving device according to an embodiment of the present invention.
Figure 2:
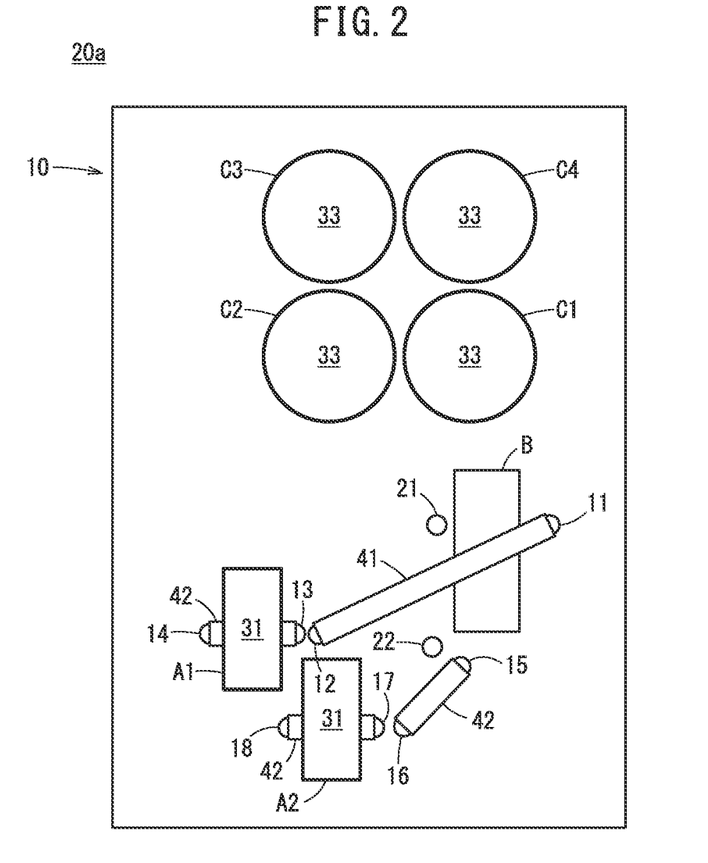
FIG. 2 is a diagram showing a motor driving circuit for use with a large electrical current.
Figure 3:
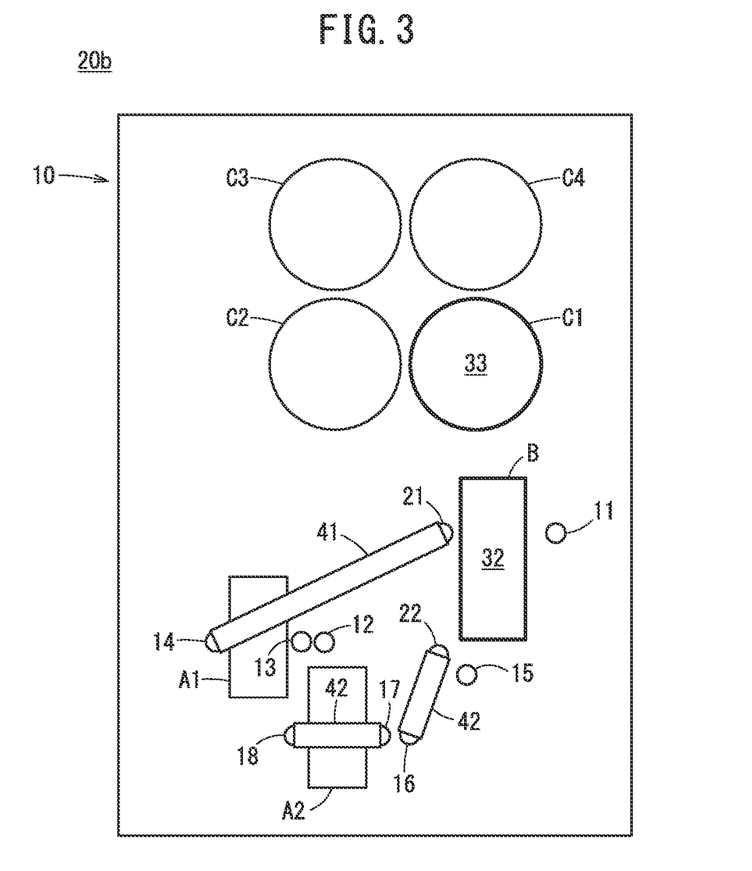
FIG. 3 is a diagram showing a motor driving circuit for use with a small electrical current.

FIG. 1 is a diagram showing a printed wiring board 10 (circuit board) for use with the motor driving device according to an embodiment of the present invention. FIGS. 2 and 3 show, respectively, the motor driving circuit 20a for use with a large output, and the motor driving circuit 20b for use with a small output, which are manufactured by using the printed wiring board 10.

The printed wiring board 10 is a common wiring board that can be used in manufacturing both the motor driving circuits 20a and 20b. As will be discussed later, depending on whether a motor driving circuit for use with a large electrical current or a small electrical current is manufactured, a component for use with a large electrical current (in this instance, an electrical current sensor 31) or a component for use with a small current (in this instance, a shunt resistance element 32) is selected and mounted on the printed wiring board 10, whereby any one of the motor driving circuits 20a and 20b can be selected and manufactured.

As shown in FIG. 1, the printed wiring board 10 is a wiring board having mounting regions A (A1, A2), B, and C (C1 to C4), and connecting points 11 to 18, 21, and 22.

In addition to the mounting regions A, B, and C, and the connecting points 11 to 18, 21, and 22, the printed wiring board 10 includes electrical components, wirings, and the like. However, for the sake of clarity, descriptions thereof will be omitted herein. The printed wiring board 10 includes, for example, wirings and electrical components that are connected to the connecting points 11 to 18, 21, and 22.

The mounting regions A (A1, A2), B, and C (C1 to C4) are visibly and distinguishably displayed on the printed wiring board 10. More specifically, so as to be capable of being distinguished from the surrounding area thereof, the mounting regions A1, A2, B, and C1 to C4, for example, may have shades or colors applied to boundaries thereof or within the regions themselves that differ from the surrounding area.

As shown in FIGS. 2 and 3, the mounting regions A1 and A2 are regions for mounting a component (in this instance, the electrical current sensor 31) for use with a large electrical current. The mounting region B is a region for mounting a component (in this instance, the shunt resistance element 32) for use with a small electrical current. One or the other of the mounting regions A1 and B corresponds to a first mounting region or a second mounting region.

More specifically, depending on whether a motor driving circuit 20 is for use with a large electrical current or for use with a small electrical current, any one of the electrical current sensor 31 and the shunt resistance element 32 is selected and mounted on the printed wiring board 10. In this instance, two electrical current sensors 31 that are used with a large electrical current are mounted in the mounting regions A1 and A2, and one shunt resistance element 32 that is used with a small electrical current is mounted in the mounting region B.

The mounting regions C1 to C4 are regions for mounting electrolytic capacitors 33. In this instance, different numbers of the electrolytic capacitors 33 are mounted for use with the large electrical current and for use with the small electrical current. In the case of being used with the large electrical current, four electrolytic capacitors 33 are mounted in all of the mounting areas C1 to C4, and in the case of being used with the small electrical current, one electrolytic capacitor 33 is mounted only in the mounting region C1.

In this instance, when viewed from above the printed wiring board 10, the shapes and sizes of the mounting regions A, B, and C correspond to the shapes of the electrical current sensors 31, the shunt resistance element 32, and the electrolytic capacitors 33 that are intended to be mounted therein. By doing so, it becomes easy to accurately mount the electrical components. Moreover, different shades or colors may be applied to the mounting regions A, B, and C, in a manner so that the mounting regions are capable of being distinguished from one another. Thus, accurate mounting of the electrical components is facilitated.

The connecting points 11 to 18, 21, and 22 are constituted from conductors to which the ends of connecting wire members 41 and 42 are connected. Two of the connecting points 11 to 18, 21, and 22 are appropriately selected, and one ends and other ends of the connecting wire members 41 and 42 are connected to the selected two connecting points. Consequently, it is possible to form an electrical current path that connects the two connecting points. The connecting points 11 to 18, 21, and 22 include connecting holes (not shown) into which later-described connecting portions 45 of the connecting wire member 41 or 42 are inserted.

As shown in FIG. 2, in a circuit for use with a large electrical current, the connecting wire member 41 (one or the other of the first connecting wire member and the second connecting wire member) is arranged between the connecting point 11 and the connecting point 12. Further, three connecting wire members 42 are arranged between the connecting point 13 and the connecting point 14, between the connecting point 15 and the connecting point 16, and between the connecting point 17 and the connecting point 18, respectively. As shown in FIG. 3, in a circuit for use with a small electrical current, one connecting wire member 41 is arranged between the connecting point 21 and the connecting point 14. Further, two of the connecting wire members 42 are arranged between the connecting point 22 and the connecting point 16, and between the connecting point 17 and the connecting point 18, respectively.

The pair of connecting points 11 and 12 and the pair of connecting points 21 and 14 correspond to one or the other of a first pair of connecting points and a second pair of connecting points. Any one of these pair of connecting points is selected, whereby the connecting wire member 41 is connected. The connecting wire member 41 is connected to the pair of connecting points 11 and 12, or alternatively, to the pair of connecting points 21 and 14. Consequently, it is possible for a path to be formed that supplies the electrical current to the electrical current sensor 31 in the mounting region A1, or to the shunt resistance element 32 in the mounting region B.

Substantially the same interval (distance) is provided between the pair of connecting points 11 and 12 and between the pair of connecting points 21 and 14 in a manner so that the connecting wire members 41, which are the same members, can be connected therebetween.

The pair of connecting points 11 and 12 straddle across the mounting region B. Therefore, when the pair of connecting points 11 and 12 are connected by the connecting wire member 41, the connecting wire member 41 is arranged so that at least a portion thereof overlaps with the mounting region B. Therefore, the shunt resistance element 32 becomes incapable of being mounted in the mounting region B. As a result, a mounting error is prevented, in which mounting of the shunt resistance element 32 (mounting of the component for use with a small electrical current) in the mounting area B and connection (connection for use with a large electrical current) of the pair of connecting points 11 and 12 by the connecting wire member 41 are carried out at the same time.

The pair of connecting points 21 and 14 straddle across the mounting region A1. Therefore, when the pair of connecting points 21 and 14 are connected by the connecting wire member 41, the connecting wire member 41 is arranged so that at least a portion thereof overlaps with the mounting region A1. Therefore, the electrical current sensor 31 cannot be mounted in the mounting region A1. As a result, a mounting error is prevented, in which mounting of the electrical current sensor 31 (mounting of the component for use with a large electrical current) in the mounting area A1 and connection (connection for use with a small electrical current) of the pair of connecting points 21 and 14 by the connecting wire member 41 are carried out at the same time.

In this instance, substantially the same interval (distance) is provided between the connecting points 13 and 14, between the connecting points 15 and 16, between the connecting points 17 and 18, and between the connecting points 22 and 16 in a manner so that the connecting wire members 42, which are the same members, can be connected therebetween.

Moreover, as shown in FIG. 3, two connecting wire members 42 are used, whereby the interval between the connecting point 22 and the connecting point 18 is connected via the connecting point 16 and the connecting point 17. However, it is also possible to use one connecting wire member 42, thereby directly connecting the connecting point 22 and the connecting point 18 in a straddling manner across the mounting region A2. In this case, it becomes unnecessary for the distance between the connecting point 22 and the connecting point 16 to be substantially the same as the distance between the connecting point 15 and the connecting point 16, or the like.

The connecting point 14 and the connecting point 16 are commonly used at the time of mounting of the components that are used with a large electrical current and at the time of mounting of the components that are used with a small electrical current. As a result, the number of connecting points is reduced, and it becomes easy to reduce mounting errors and to reduce the mounting area.

Figure 4:
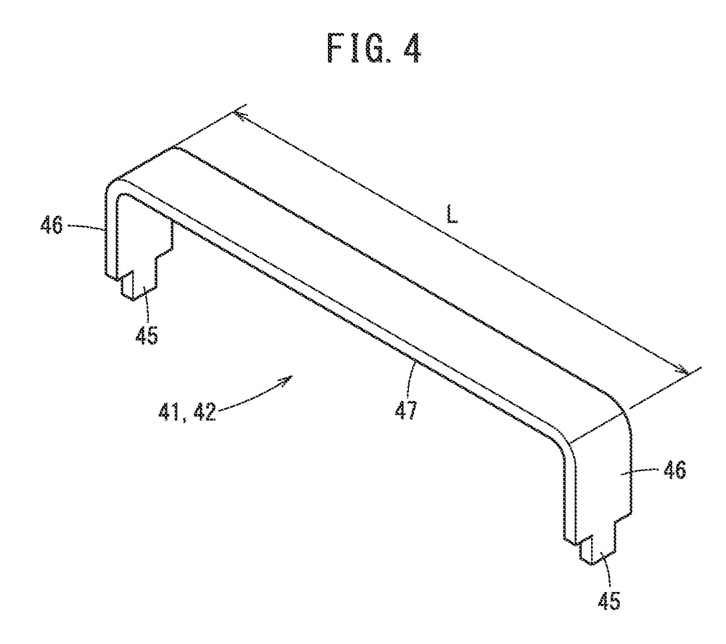
FIG. 4 is a perspective view of a connecting wire member.

FIG. 4 is a perspective view of the connecting wire members 41 and 42. As shown in FIG. 4, each of the connecting wire members 41 and 42 has a shape in which a narrow elongated flat plate is bent, and includes the connecting portions 45, coupling portions 46, and a horizontal conductor portion 47. It should be noted that the connecting wire members 41 and 42 are not limited to being flat plates, and may be manufactured by bending an electrical wire or a round bar.

The connecting portions 45 are arranged at both ends of each of the connecting wire members 41 and 42, and are connected to any of the connecting points 11 to 18, 21, and 22. The connecting portions 45 can be inserted into connecting holes of the connecting points 11 to 18, 21 and 22, and can be connected using solder or the like.

The horizontal conductor portion 47 is coupled to the connecting portions 45 via the coupling portions 46, and is arranged substantially in parallel with a main surface of the printed wiring board 10 at a time of being mounted. A length L of the horizontal conductor portion 47 differs between the connecting wire member 41 and the connecting wire member 42. The length L of the horizontal conductor portion 47 of the connecting wire member 41 is longer than the length L of the horizontal conductor portion 47 of the connecting wire member 42. The connecting wire member 41 has a length corresponding to the interval between the connecting points 11 and 12, and the interval between the connecting points 21 and 14. The connecting wire member 42 has a length corresponding to the interval between the connecting points 13 and 14, the interval between the connecting points 15 and 16, the interval between the connecting points 17 and 18, and the interval between the connecting points 22 and 16.

The electrical current sensor 31 can be configured using a substantially cylindrical core (magnetic material core), and a Hall IC that is arranged in a gap formed in the core. More specifically, the electrical current sensor 31 has a substantially cylindrical shape including an axis substantially in parallel with the main surface of the printed wiring board 10. The horizontal conductor portion 47 of the connecting wire member 42 passes through the interior of such a cylinder. More specifically, when the electrical current sensor 31 and the connecting wire member 42 are mounted, they can be seen to overlap in a plane when viewed from a direction perpendicular to the main surface of the printed wiring board 10, but they do not overlap one another in three dimensions. In other words, after the electrical current sensor 31 has been mounted, the connecting wire member 42 can be mounted without interfering with the electrical current sensor 31.

The electrical current sensor 31 detects the electrical current flowing through the horizontal conductor portion 47 of the connecting wire member 42 which passes through the interior of the core thereof. The core receives a magnetic field generated from the electrical current flowing through the horizontal conductor portion 47, and the Hall IC converts the magnetic field into a voltage. Consequently, the electrical current flowing through the horizontal conductor portion 47 can be detected.

The shunt resistance element 32 has a substantially rectangular parallelepiped shape, has a shunt resistance (low resistance) that is used for detecting an electrical current, and detects the electrical current by using a drop in voltage between both ends thereof.

In this instance, a single shunt resistance element 32 is used to detect a two-phase electrical current. Therefore, the shunt resistance element 32 includes two detection elements corresponding to the respective phases. However, it is also possible to use a shunt resistance element that includes one detection element. In this case, two shunt resistance elements are mounted.

Switching of the electrical current detection elements for detection of a large electrical current and for detection of a small electrical current is performed in this manner by taking into consideration the advantages and disadvantages of the electrical current sensor 31 and the shunt resistance element 32. The shunt resistance element 32 has better detection accuracy and responsiveness in comparison with the electrical current sensor 31. However, the amount of heat generated thereby is large. Therefore, different components are selected in accordance with the output electrical current, i.e., the shunt resistance element 32 is selected for a small electrical current, and the electrical current sensor 31 is selected for a large electrical current.

In this instance, as shown in FIG. 2, when the connecting wire member 41 that is used with a large electrical current is connected between the connecting point 11 and the connecting point 12, at least a portion of the horizontal conductor portion 47 of the connecting wire member 41 overlaps with the mounting region B. The shunt resistance element 32 for use with a small electrical current is incapable of being mounted in the mounting region B. In other words, the connection of the connecting wire member 41 for use with a large electrical current is incompatible with mounting of the shunt resistance element 32 for use with a small electrical current. As a result, a mounting error is prevented, in which connection of the connecting wire member 41 for use with a large electrical current and mounting of the shunt resistance element 32 for use with a small electrical current are performed in combination.

Further, as shown in FIG. 3, when the connecting wire member 41 that is used with a small electrical current is connected between the connecting point 21 and the connecting point 14, at least a portion of the horizontal conductor portion 47 of the connecting wire member 41 overlaps with the mounting region A1. The electrical current sensor 31 for use with a large electrical current is incapable of being mounted in the mounting region A1. In other words, the connection of the connecting wire member 41 for use with a small electrical current is incompatible with mounting of the electrical current sensor 31 for use with a large electrical current in the mounting region A1. As a result, a mounting error is prevented, in which connection of the connecting wire member 41 for use with a small electrical current and mounting of the electrical current sensor 31 for use with a large electrical current are performed in combination.

(Method of Manufacturing Motor Driving Device)

The motor driving device can be manufactured according to the following procedure.

At first, the printed wiring board 10 shown in FIG. 1 is prepared (preparation step). Then, which one of the motor driving circuit 20 for use with a large electrical current or the motor driving circuit 20 for use with a small electrical current is to be manufactured from the printed wiring board 10, is selected. In accordance with this selection, mounting of the electrical components (a mounting step), and connection between the connecting points (a connection step) are performed.

(1) In the case that a large electrical current is selected, the members are arranged in the following manner.

Electrical Current Sensors 31: Mounting Regions A1 and A2

Electrolytic Capacitors 33: Mounting Regions C1 to C4

Connecting Wire Member 41: Between Connecting Points 11 and 12

Connecting Wire Member 42: Between Connecting Points 13 and 14, Between Connecting Points 15 and 16, and Between Connecting Points 17 and 18

It should be noted that members (the shunt resistance element 32, or the connecting wire members 41 and 42) are not mounted in the mounting region B, or the connecting points 21 and 22.

(2) In the case that a small electrical current is selected, the members are arranged in the following manner.

Shunt Resistance Element 32: Mounting Region B

Electrolytic Capacitor 33: Mounting Region C1

Connecting Wire Member 41: Between Connecting Points 21 and 14

Connecting Wire Member 42: Between Connecting Points 22 and 16, and Between Connecting Points 17 and 18

It should be noted that members (the electrical current sensors 31, the electrolytic capacitors 33, or the connecting wire members 41 and 42) are not mounted in the mounting regions A1, A2, and C2 to C4, or the connecting points 11, 12, 13, and 15.

By incorporating the motor driving circuit 20 which is produced in the foregoing manner, the motor driving device can be manufactured.

In this manner, according to the present embodiment, by selecting and arranging the components for use with a large electrical current and the components for use with a small electrical current on the printed wiring board 10, the motor driving circuit 20 for use with a large electrical current or for use with a small electrical current can be manufactured. The printed wiring board 10 can be used in common, and therefore, manufacturing costs can be reduced. Further, by commonly using the connecting wire members 41 and 42, manufacturing costs can also be reduced.

By superimposing the arrangement location of the electrical component (the electrical current sensor 31) for use with a large electrical current and the arrangement location of the connecting wire member 41 at the time of a small electrical current, it is possible to prevent an enlargement of the area of the wiring board, and to prevent mounting errors from occurring. Further, by superimposing the arrangement location of the electrical component (the shunt resistance element 32) for use with a small electrical current and the arrangement location of the connecting wire member 41 at the time of a large electrical current, it is possible to prevent an enlargement of the area of the wiring board, and to prevent mounting errors from occurring.

Inventions that can be Obtained from the Embodiment

Hereinafter, a description will be given concerning the technical concepts that can be grasped from the above-described embodiment.

[1] The motor driving device according to the embodiment comprises a wiring board (the printed wiring board 10), a first mounting region (one of the mounting regions A1 and B) on the wiring board, the first mounting region enabling a first circuit component (one of the electrical current sensor 31 or the shunt resistance element 32) to be mounted therein, a second mounting region (another one of the mounting regions A1 and B) on the wiring board, the second mounting region enabling a second circuit component (another one of the electrical current sensor 31 or the shunt resistance element 32) to be mounted therein, a first pair of connecting points (one of the connecting points 11, 12 or the connecting points 21, 14) that connect the first connecting wire member 41, which constitutes a first path through which an electrical current is supplied to the first circuit component, onto the wiring board in a manner so that at least a portion of the first connecting wire member overlaps with the second mounting region, and a second pair of connecting points (another one of the connecting points 11, 12 or the connecting points 21, 14) that connect the second connecting wire member 41, which constitutes a second path through which an electrical current is supplied to the second circuit component, onto the wiring board in a manner so that at least a portion of the second connecting wire member overlaps with the first mounting region.

In accordance with such features, both a mounting error in which mounting of the first circuit component and connection by the second connecting wire member are mistakenly carried out, and a mounting error in which mounting of the second circuit component and connection by the first connecting wire member are mistakenly carried out, are prevented.

[2] Each of the first mounting region and the second mounting region is visibly and distinguishably displayed on the wiring board. In accordance with this feature, the suitability of the mounting of the first circuit component or the second circuit component is improved.

[3] The interval between the first pair of connecting points and the interval between the second pair of connecting points are substantially identical to each other. In accordance with this feature, it becomes possible to connect members having the same shape, and thus efficiency in manufacturing is improved. More specifically, the first connecting wire member and the second connecting wire member can be the same member.

[4] One of the first circuit component or the second circuit component is a component for use with a large electrical current, and another one of the first circuit component or the second circuit component is a component for use with a small electrical current. In accordance with this feature, it is possible to manufacture circuits for use with a large current and for use with a small current by using the same wiring board.

[5] The first circuit component and the second circuit component are components used for detecting an electrical current. In accordance with this feature, it is possible to deal with different current ranges using the same wiring board.

[6] The method for manufacturing the motor driving device comprises the preparation step, the mounting step, and the connection step.

In the preparation step, a printed wiring board is prepared. The printed wiring board includes the first mounting region that enables the first circuit component to be mounted therein, the second mounting region that enables the second circuit component to be mounted therein, the first pair of connecting points on the wiring board which, by being connected to each other, constitute a portion of a first path through which an electrical current is supplied to the first circuit component, and the second pair of connecting points on the wiring board which, by being connected to each other, constitute a portion of a second path through which an electrical current is supplied to the second circuit component.

In the mounting step, the first circuit component is mounted in the first mounting region, or alternatively, the second circuit component is mounted in the second mounting region.

In the connection step, in the case that the first circuit component is mounted in the mounting step, the first pair of connecting points are connected by the first connecting wire member at least a portion of which overlaps with the second mounting region, and in the case that the second circuit component is mounted in the mounting step, the second pair of connecting points are connected by the second connecting wire member at least a portion of which overlaps with the first mounting region.

In accordance with such features, by using the common printed wiring board, it is possible to reduce mounting errors in the case that either the first circuit component or the second circuit component is selected and mounted.

The invention claimed is:

1. A motor driving device, comprising:
   a wiring board;
   a first mounting region on the wiring board, the first mounting region being configured to enable a first circuit component to be mounted therein;
   a second mounting region on the wiring board, the second mounting region being configured to enable a second circuit component to be mounted therein;
   a first pair of connecting points configured to connect a first connecting wire member, which constitutes a first path through which an electrical current is supplied to the first circuit component, onto the wiring board in a manner so that at least a portion of the first connecting wire member overlaps with the second mounting region; and
   a second pair of connecting points configured to connect a second connecting wire member, which constitutes a second path through which an electrical current is supplied to the second circuit component, onto the wiring board in a manner so that at least a portion of the second connecting wire member overlaps with the first mounting region,
   wherein
   the first pair of connecting points and the second pair of connecting points are arranged outside the first mounting region and the second mounting region,
   in a case where the first connecting wire member is connected to the first pair of connecting points, mounting of the second circuit component in the second mounting region is inhibited by the first connecting wire member that overlaps with the second mounting region, and
   in a case where the second connecting wire member is connected to the second pair of connecting points, mounting of the first circuit component in the first mounting region is inhibited by the second connecting wire member that overlaps with the first mounting region.

2. The motor driving device according to claim 1, wherein each of the first mounting region and the second mounting region is visibly and distinguishably displayed on the wiring board.

3. The motor driving device according to claim 1, wherein an interval between the first pair of connecting points and an interval between the second pair of connecting points are substantially identical to each other.

4. The motor driving device according to claim 3, wherein the first connecting wire member is an identical member to the second connecting wire member.

5. The motor driving device according to claim 1, wherein:
   one of the first circuit component or the second circuit component is a component for use with a large electrical current; and
   another one of the first circuit component or the second circuit component is a component for use with a small electrical current.

6. The motor driving device according to claim 1, wherein the first circuit component and the second circuit component are components used for detecting an electrical current.

7. A method for manufacturing a motor driving device, the method comprising:
   a preparation step of preparing a printed wiring board, the printed wiring board including
   a first mounting region configured to enable a first circuit component to be mounted therein,
   a second mounting region configured to enable a second circuit component to be mounted therein,
   a first pair of connecting points on a wiring board which, by being connected to each other, constitute a portion of a first path through which an electrical current is supplied to the first circuit component, and
   a second pair of connecting points on the wiring board which, by being connected to each other, constitute a portion of a second path through which an electrical current is supplied to the second circuit component;
   a mounting step of mounting the first circuit component in the first mounting region, or alternatively, mounting the second circuit component in the second mounting region; and
   a connection step of connecting the first pair of connecting points by a first connecting wire member at least a portion of which overlaps with the second mounting region, in a case that the first circuit component is mounted in the mounting step, and connecting the second pair of connecting points by a second connecting wire member at least a portion of which overlaps with the first mounting region, in a case that the second circuit component is mounted in the mounting step,
   wherein
   the first pair of connecting points and the second pair of connecting points are arranged outside the first mounting region and the second mounting region,
   in a case where the first connecting wire member is connected to the first pair of connecting points, mounting of the second circuit component in the second mounting region is inhibited by the first connecting wire member that overlaps with the second mounting region, and in a case where the second connecting wire member is connected to the second pair of connecting points, mounting of the first circuit component in the first mounting region is inhibited by the second connecting wire member that overlaps with the first mounting region.

\* \* \* \* \*